US010680660B2

(12) United States Patent
Saber et al.

(10) Patent No.: US 10,680,660 B2
(45) Date of Patent: Jun. 9, 2020

(54) METHOD AND APPARATUS FOR DISTRIBUTING ASSISTANT BITS IN ENCODING

(71) Applicants: Hamid Saber, Ottawa (CA); Yiqun Ge, Ottawa (CA)

(72) Inventors: Hamid Saber, Ottawa (CA); Yiqun Ge, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/970,381

(22) Filed: May 3, 2018

(65) Prior Publication Data

US 2018/0351584 A1 Dec. 6, 2018

Related U.S. Application Data

(60) Provisional application No. 62/515,054, filed on Jun. 5, 2017.

(51) Int. Cl.
H03M 13/00 (2006.01)
H03M 13/27 (2006.01)
H03M 13/09 (2006.01)
H03M 13/13 (2006.01)
H03M 13/29 (2006.01)

(52) U.S. Cl.
CPC ......... H03M 13/611 (2013.01); H03M 13/09 (2013.01); H03M 13/13 (2013.01); H03M 13/27 (2013.01); H03M 13/2906 (2013.01); H03M 13/616 (2013.01)

(58) Field of Classification Search
CPC .. H03M 13/611; H03M 13/27; H03M 13/616; H03M 13/09; H03M 13/13; H03M 13/2906
See application file for complete search history.

(56) References Cited

U.S. PATENT DOCUMENTS

| 2017/0257186 | A1* | 9/2017 | Ge | H03M 13/096 |
| 2018/0124815 | A1* | 5/2018 | Papasakellariou | H04L 1/1671 |
| 2018/0198555 | A1* | 7/2018 | Wu | H04L 1/0009 |
| 2019/0158226 | A1* | 5/2019 | Hui | H03M 13/13 |
| 2019/0166611 | A1* | 5/2019 | Noh | H04W 72/1273 |
| 2019/0173499 | A1* | 6/2019 | Zheng | H03M 13/6306 |

OTHER PUBLICATIONS

R1-1708833 Nokia et al.,"Design details of distributed CRC",3GPP TSG RAN WG1 Meeting #89,Hangzhou, P.R. China May 15-19, 2017,total 7 pages.
R1-1706965 Huawei, HiSilicon,"Polar code design",3GPP TSG RAN WG1 Meeting #89,Hangzhou, China, May 15-19, 2017,total 12 pages.

(Continued)

Primary Examiner — Samir W Rizk

(57) ABSTRACT

Method and apparatus for generating a codeword by interleaving information and assistant bits. An interleaved sequence of information bits and assistant bits is generated according to an interleaving order. The interleaving order is selected to reduce a number of information bits occurring before a first assistant bit and further reduce each subsequent number of additional information bits occurring between assistant bits. The interleaved sequence is encoded using a polar code to generate a codeword, and the codeword is transmitted.

20 Claims, 10 Drawing Sheets

(56) References Cited

OTHER PUBLICATIONS

R1-1708488 NTT DOCOMO,"Distributed simple parity check Polar codes",3GPP TSG RAN WG1 Meeting #89,Hangzhou, China May 15-19, 2017,total 8 pages.
R1-1713303 AccelerComm,"On the hardware implementation of CRC interleaving",3GPP TSG RAN WG1 Meeting #90,Prague, Czech Republic, Aug. 21-25, 2017,total 19 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

FIG. 1

METHOD AND APPARATUS FOR DISTRIBUTING ASSISTANT BITS IN ENCODING

CROSS-REFERENCE TO RELATED APPLICATIONS

The present disclosure claims priority from U.S. provisional patent application No. 62/515,054, entitled "METHOD AND APPARATUS FOR DISTRIBUTING ASSISTANT BITS IN ENCODING", filed Jun. 5, 2017, the entirety of which is hereby incorporated by reference.

FIELD

The present disclosure relates to methods and apparatus for encoding a codeword, including distribution of information bits and assistant bits over sub-channels.

BACKGROUND

Polar codes have been proposed to be used as channel codes for wireless communications, including for uplink and downlink enhanced mobile broadband (eMBB) control channel coding for 5G air interface. Polar codes have been found to have performance that is at least comparable with state-of-the-art error correction codes, and have relatively low encoding complexity. An example is described by E. Arikan in "Channel polarization: A method for constructing capacity-achieving codes for symmetric binary-input memoryless channels," *IEEE Trans. Inf. Theory*, vol. 55, no. 7, pp. 3051-3073, 2009.

Parity-check (PC) polar codes employ assistant bits to improve the performance of polar codes. There are different variations of polar codes that can be considered as special cases of PC-polar codes. For example, cyclic redundancy check (CRC) polar codes are a type of PC-polar code in which the assistant bits are calculated using a CRC polynomial. With PC-polar codes, the bits are transmitted in sub-channels, which may be referred to as follows: the information sub-channels are used to carry the information bits; the frozen sub-channels carry deterministic bits (referred to as frozen bits); and the assistant sub-channels carry assistant bits. For PC-polar codes, the assistant bits may be related to the information bits using PC equations. Different performance aspects (e.g., power consumption) of PC-polar codes depend on the selection of PC sub-channels and the PC equations.

With PC-polar codes (e.g., PC-frozen polar codes, CRC-polar codes or other types using assistant bits), the information bits and the assistant bits are placed in the information sub-channels and all are treated as information bits when the decoder performs successive cancellation list (SCL) decoding. At the end of decoding, each list path is checked to see if the parity check is passed. A path which does not pass the check will be considered as wrong or unsuccessful. If no path passes checking, a decoding failure is declared. If none of the paths passes the check, this means that there is at least one assistant bit that violates the PC equations for all paths. If the decoder had checked the PC equation for this one assistant bit earlier in decoding, the decoder could have avoided all the unnecessary subsequent decoding calculations and terminated the decoding early by declaring a decoding failure after encountering this one assistant bit. This is referred to as early termination (ET) and can significantly mitigate the decoding complexity. Distribution of assistant bits directly affects the ET performance, including whether ET is even possible.

SUMMARY

In the present disclosure, example methods are provided for interleaving assistant bits and information bits over the sub-channels, to achieve earlier occurrence of early termination during decoding. The relevant information bits for each assistant bit may be identified (e.g., using a PC matrix), and this information may be used to select the interleaving order in which the information bits and assistant bits are placed over the sub-channels.

In some examples, where the PC matrix has a nested property, the method for interleaving the information and assistant bits may be adapted for information vectors of different lengths.

In some aspects, the present disclosure describes an apparatus including a polar encoder and a transmitter coupled to the encoder. The encoder is configured to generate an interleaved sequence of information bits and assistant bits according to an interleaving order. The interleaving order is selected to reduce a number of information bits occurring before a first assistant bit and further reduce each subsequent number of additional information bits occurring between assistant bits. The encoder is further configured to encode the interleaved sequence using a polar code to generate a codeword. The transmitter is configured for transmitting the codeword.

In some aspects, the present disclosure describes a method including generating an interleaved sequence of information bits and assistant bits according to an interleaving order. The interleaving order is selected to reduce a number of information bits occurring before a first assistant bit and further reduce each subsequent number of additional information bits occurring between assistant bits. The method further includes encoding the interleaved sequence using a polar code to generate a codeword, and transmitting the codeword.

In any of the aspects/embodiments described above, the assistant bits may be generated by applying a parity check matrix to the information bits.

In any of the aspects/embodiments described above, the parity check matrix may be calculated using a parity check polynomial.

In any of the aspects/embodiments described above, there may be a stored interleaving order. The stored interleaving order may be used as the interleaving order for generating the interleaved sequence. In an apparatus, the stored interleaving order may be stored in a memory coupled to the encoder.

In any of the aspects/embodiments described above, there may be a plurality of stored interleaving orders, each interleaving order being associated with a respective number of information bits. For a given number of information bits inputted to the encoder, one of the stored interleaving orders may be selected for generating the interleaved sequence. The selected interleaving order may be associated with a number of information bits that is (a) equal to or greater than the given number of information bits and (b) closest to the given number of information bits.

In any of the aspects/embodiments described above, when the stored interleaving order includes one or more higher index information bits that has a higher index than the information bits inputted to the encoder, the one or more higher index information bits may be removed from the interleaving order to generate a shortened interleaving order.

The shortened interleaving order may be used as the interleaving order for generating the interleaved sequence.

In any of the aspects/embodiments described above, the interleaving order may be generated by selecting one of the assistant bits as a first occurring assistant bit in the interleaving order. The selected one assistant bit may be associated with a smallest set of relevant information bits among all assistant bits. The interleaving order may be further generated by iteratively selecting subsequent assistant bits in the interleaving order by selecting, from unselected assistant bits, an assistant bit dependent on a smallest number of additional information bits.

In any of the aspects/embodiments described above, the interleaving order may be generated for a given number of information bits to be encoded. The generated interleaving order may be stored as an interleaving order associated with the given number of information bits.

In some aspects, the present disclosure describes an apparatus including a polar encoder and a transmitter. The encoder is configured to obtain, from a memory coupled to the encoder, a stored interleaving order for interleaving K inputted information bits and m assistant bits. The stored interleaving order is selected according to a maximum number $K_{max}$ of information bits. The stored interleaving order is also selected to minimize a number of information bits occurring before a first assistant bit and further minimize each subsequent number of additional information bits occurring between assistant bits. The encoder is further configured to, when the number K of inputted information bits is equal to $K_{max}$, generate an interleaved sequence of information bits and assistant bits according to the stored interleaving order. The encoder is further configured to, when the number K of inputted information bits is less than $K_{max}$, generate an interleaved sequence of information bits and assistant bits according to a shortened interleaving order. The shortened interleaving order is obtained by removing from the stored interleaving order all information bits having an index of K or greater. The encoder is further configured to encode the interleaved sequence using a polar code to generate a codeword. The transmitter is configured for transmitting the codeword.

In some aspects, the present disclosure describes a method including obtaining a stored interleaving order for interleaving K inputted information bits and m assistant bits. The stored interleaving order is selected according to a maximum number $K_{max}$ of information bits. The stored interleaving order is also selected to minimize a number of information bits occurring before a first assistant bit and further minimize each subsequent number of additional information bits occurring between assistant bits. The method further includes, when the number K of inputted information bits is equal to $K_{max}$, generating an interleaved sequence of information bits and assistant bits according to the stored interleaving order. The method further includes, when the number K of inputted information bits is less than $K_{max}$, generating an interleaved sequence of information bits and assistant bits according to a shortened interleaving order. The shortened interleaving order is obtained by removing from the stored interleaving order all information bits having an index of K or greater. The method further includes encoding the interleaved sequence using a polar code to generate a codeword, and transmitting the codeword.

In any of the aspects/embodiments described above, the assistant bits may be generated by applying a parity check matrix to the information bits.

BRIEF DESCRIPTION OF THE DRAWINGS

Reference will now be made, by way of example, to the accompanying drawings which show example embodiments of the present application, and in which:

FIG. 1 illustrates how a polar coding generator matrix may be produced from a kernel;

Similar reference numerals may have been used in different figures to denote similar components.

DESCRIPTION OF EXAMPLE EMBODIMENTS

To assist in understanding the present disclosure, the following discussion of polar coding is provided. The present disclosure is discussed in the context of polar codes, however the present disclosure may be applicable to other channel codes including any other forward error correction (FEC) codes, such as convolutional codes and Turbo codes. FIG. 1 is a diagram showing how a polar coding generator matrix can be produced from a kernel $G_2$ 100. Other forms of kernel may be used. The 2-fold Kronecker product matrix $G_2 \otimes^2$ 102 and the 3-fold Kronecker product matrix $G_2 \otimes^3$ 104 in FIG. 1 are examples of polar coding generator matrices. The generator matrix approach illustrated in FIG. 1 can be generalized to produce an m-fold Kronecker product matrix $G_2 \otimes^m$.

Figure 2:
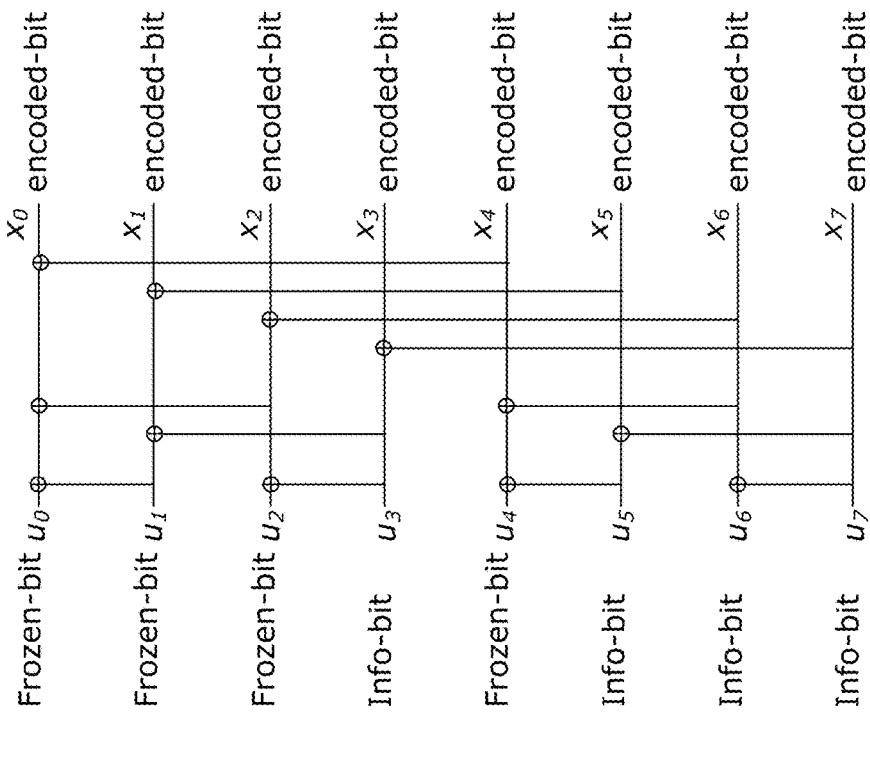
FIG. 2 illustrates an example use of a polar coding generator matrix for producing codewords, and an example polar encoder.

A polar code can be formed from a Kronecker product matrix based on the kernel $G_2$ 100. For a polar code having codewords of length $N=2^m$, the generator matrix is $G_2 \otimes^m$. FIG. 2 is a diagram showing an example use of a polar coding generator matrix for producing codewords and a schematic illustration of an example polar encoder. In FIG. 2, the generator matrix $G_2 \otimes^3$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2 \otimes^3$ 104 as indicated at 200. The input vector u is composed of frozen bits and information bits. In the specific example shown in FIG. 2, $N=2^3=8$, so the input vector u is an 8-bit vector, and the codeword x is an 8-bit vector.

In polar code construction, the input vector carries information only in the information bits, which have predefined positions in the input vector. The remaining bits of the input vector do not carry information and are referred to as frozen bits. The positions of the frozen bits in the input vector are known to both the encoder and the decoder. Typically, the more "reliable" positions of an input vector are used to carry the information bits, and the more "unreliable" positions of an input vector are used to carry the frozen bits. When information is transmitted over a physical channel, the reliability of a given bit position is also a function of the characteristics of the physical channel, such as the erasure rate of the physical channel. A reliability sequence (which defines reliable and unreliable positions) may be calculated based on assumed characteristics of the physical channel before the information is transmitted over the channel. The frozen bits can be set to any value so long as the location of each frozen bit is known to both the encoder and the decoder. For example, the frozen may all be set to zero.

In the example of FIG. 2, the input vector has frozen bits in positions 0,1,2 and 4, and has information bits in positions 3,5,6, and 7. It should be understood that the positions of the frozen bits (also referred to as the frozen positions) may be different, as long as the frozen positions are known to both the encoder and the decoder. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits.

The output of the encoder is a codeword, which in turn is transmitted over a channel by a transmitter. A receiver, in turn, receives a word over the channel. Due to channel effects such as noise, the received word might not be identical to the transmitted codeword. A decoder attempts to decode the received word to determine information bits in the original input vector. Codes of the form described above may be referred to as polar codes and the encoder may be referred to as a polar encoder. Decoders for decoding polar codes may be referred to as polar decoders.

Assistant bits can be included in the input vector to assist in decoding. Assistant bits are neither information bits nor frozen bits, but may be generated from information bits according to a process that is known to both the encoder and the decoder. Assistant bits may also be referred to as error detection bits, error correction bits, or path selection bits, for example, but are referred to herein primarily as assistant or decoding-assistant bits. Examples of assistant bits include extra CRC bits, parity check (PC) bits, hash function bits, and checksum bits. The information bits that are used to generate a given assistant bit are referred to as the relevant information bits for that assistant bit. As will be discussed further below, the set of relevant information bits for each respective assistant bit may be used to determine how to distribute the assistant bits among the information bits.

Figure 3:
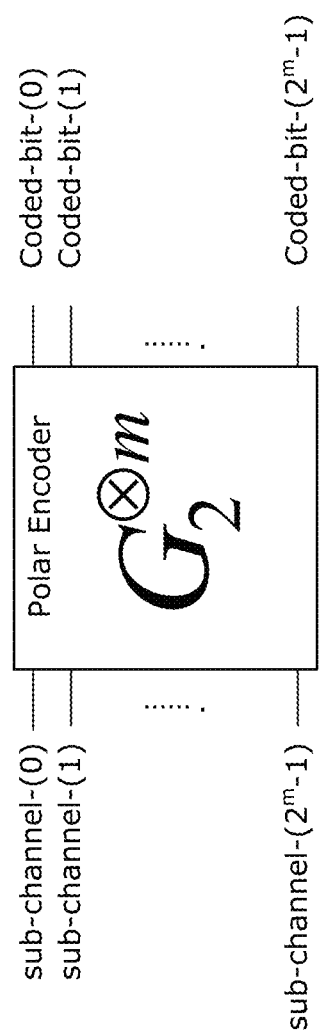
FIG. 3 is a block diagram illustrating an example polar encoder based on a 2-by-2 kernel.

FIG. 3 is a block diagram illustrating an example of a polar encoder that uses an m-fold Kronecker product matrix $G_2^{\otimes m}$, based on a 2×2 kernel $G_2$. Sub-channels and coded bits are labeled in FIG. 3. As discussed in further detail below, a channel is divided into N sub-channels. Input bits are allocated onto the N sub-channels, and the resultant 1×N input vector is multiplied with an N-by-N Kronecker matrix by the polar encoder to generate a codeword that includes N coded bits. The input bits include information bits, frozen bits and may also include assistant bits. The assistant bits may be CRC bits. A sub-channel selector (not shown) may be coupled to the polar encoder to select at least information sub-channels and assistant sub-channels, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching other purposes.

Figure 4:
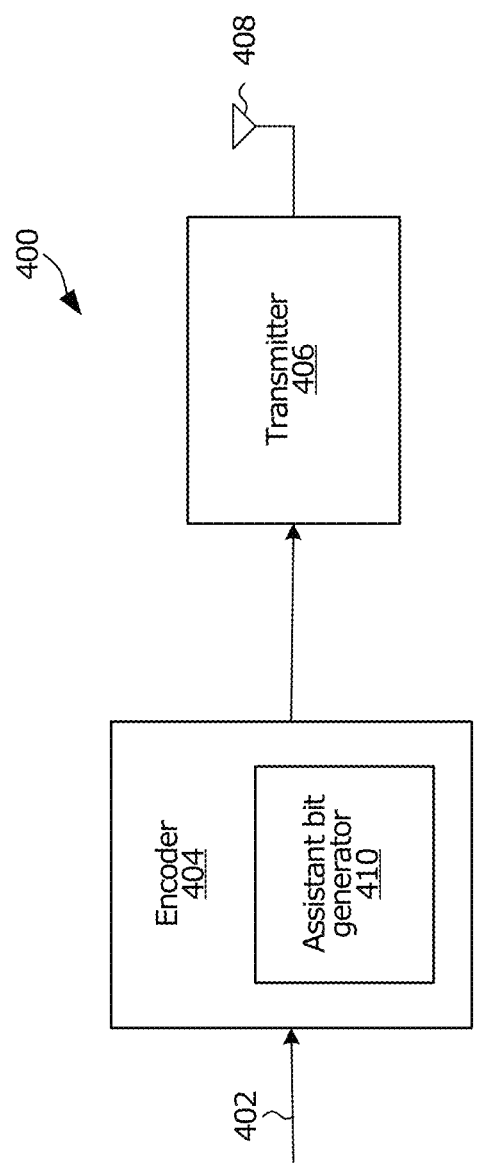
FIG. 4 is a block diagram of an example apparatus for encoding and transmitting codewords.

FIG. 4 is a simplified block diagram of an apparatus 400 for encoding and transmitting codewords, which may be used to implement examples disclosed herein. The example apparatus 400 includes an encoder 404 coupled to a transmitter 406. The encoder 404 is configured to encode an input bit stream 402, as disclosed herein. In the example shown, the apparatus 400 also includes an antenna 408, coupled to the transmitter 406, for transmitting signals over a wireless channel. In some examples, the transmitter 406 may include a modulator, an amplifier, and/or other components of a radio frequency (RF) transmit chain. The encoder 404 may be implemented in circuitry, such as a processor, that is configured to encode input bits from the input bit stream 402, as disclosed herein.

The encoder 404 is configured to encode input bits with a code that defines sub-channels, each of the sub-channels having an associated reliability of correct decoding of an input bit at an input bit position. The encoder 404 for a PC-polar code or other FEC code may include an assistant bit generator 410, for generating assistant bits from the input information bits. Although shown as a distinct component in FIG. 4, it should be understood that the assistant bit generator 410 need not be a distinct module or component of the encoder 404, rather the functions of the assistant bit generator 410 (described further below) may be performed by the encoder 404 generally. The encoder 404, or a sub-channel selector (not shown) coupled to the encoder 404, for example, may be configured to select, from each of a plurality of non-adjacent segments that each comprise a subset of consecutive sub-channels, and based on the associated reliabilities of the sub-channels, one or more assistant sub-channels to carry decoding assistant bits among the input bits.

The apparatus 400 could implement any of various other features that are disclosed herein. In some examples, the functionality of the encoder 404 and transmitter 406 may be fully or partially implemented in software or modules, for example in encoding and transmitting modules stored in a memory and executed by a processor(s) of the apparatus 400.

Figure 5:
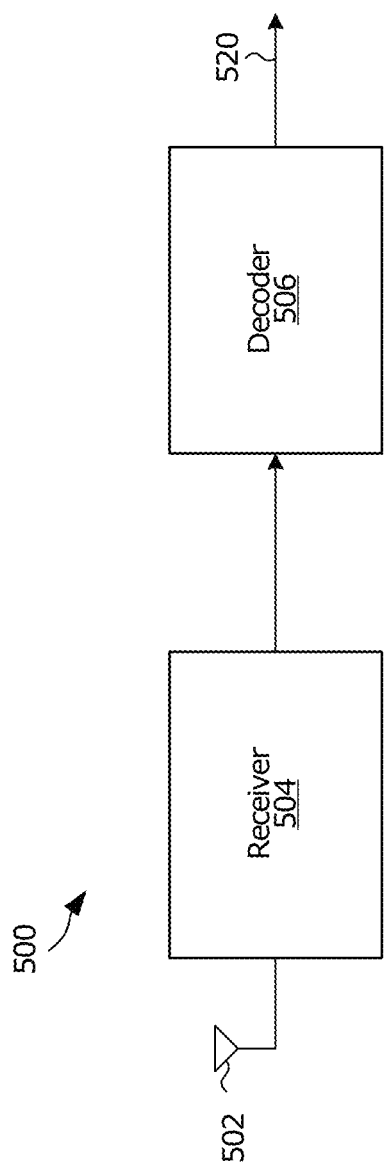
FIG. 5 is a block diagram of an example apparatus for receiving and decoding codewords.

FIG. 5 is a simplified block diagram of an example apparatus 500 for receiving and decoding codewords. The apparatus 500 includes a receiver 504 coupled to an antenna 502 for receiving signals from a wireless channel, and a decoder 506. In some examples, the antenna 502 in FIG. 5 and the antenna 408 in FIG. 4 may be the same antenna. That is, a single antenna (or antenna array) may be used for both receiving and transmitting. In some examples, the receiver 504 may include a demodulator, an amplifier, and/or other components of an RF receive chain. The receiver 504 receives, via the antenna 502, a word that is based on a codeword. Decoded bits are output at 520 for further receiver processing. The decoder 506 is configured to decode received codewords. Assistant bits (if used for encoding the codeword) may be used by the decoder 506 to assist in decoding.

Generally, the configuration of the decoder 506 is dependent on how the codeword is encoded at the encoder, including how the information and assistant bits have been interleaved (described further below). For example, for decoding polar code, the decoder 506 may be a sequential decoder. A sequential decoder may be used for other channel codes, including other FEC codes. In a sequential decoder, the decoder processes the received codeword bit-by-bit, and if the decoder reaches a bit during decoding that is identified as a decoding failure event, the decoder can terminate the decoding task (without decoding the remainder of the codeword)—that is, the decoder can take advantage of early termination (ET).

In some examples, the functionality of the receiver 504 and decoder 506 described herein may be fully or partially implemented in software or modules, for example in receiving and decoding modules stored in a memory and executed by a processor(s) of the apparatus 500.

In some examples, the apparatus 500 of FIG. 5, and similarly the apparatus 400 in FIG. 4 may include a non-transitory computer readable medium that includes instructions for execution by a processor to implement and/or control operation of the encoder 404 in FIG. 4, to implement and/or control operation of the decoder 506 in FIG. 5, and/or to otherwise control the execution of methods described herein. The non-transitory medium could include one or more solid-state memory devices and/or memory devices with movable and possibly removable storage media. In some examples, the processor may be a component of a general-purpose computer hardware platform. In other embodiments, the processor may be a component of a special-purpose hardware platform. For example, the processor may be an embedded processor, and the instructions may be provided as firmware. Some examples may be implemented by using hardware only. In some examples, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk.

The apparatus 400, the apparatus 500, or both may be implemented in an electronic device (ED) configured for wireless communication. The ED may be any suitable user equipment or communication network equipment, such as a WLAN device, and may include mobile or stationary devices such as smartphones, laptops, mobile phones, tablet devices and/or Internet of Things (IoT) devices, for example.

Figure 6:
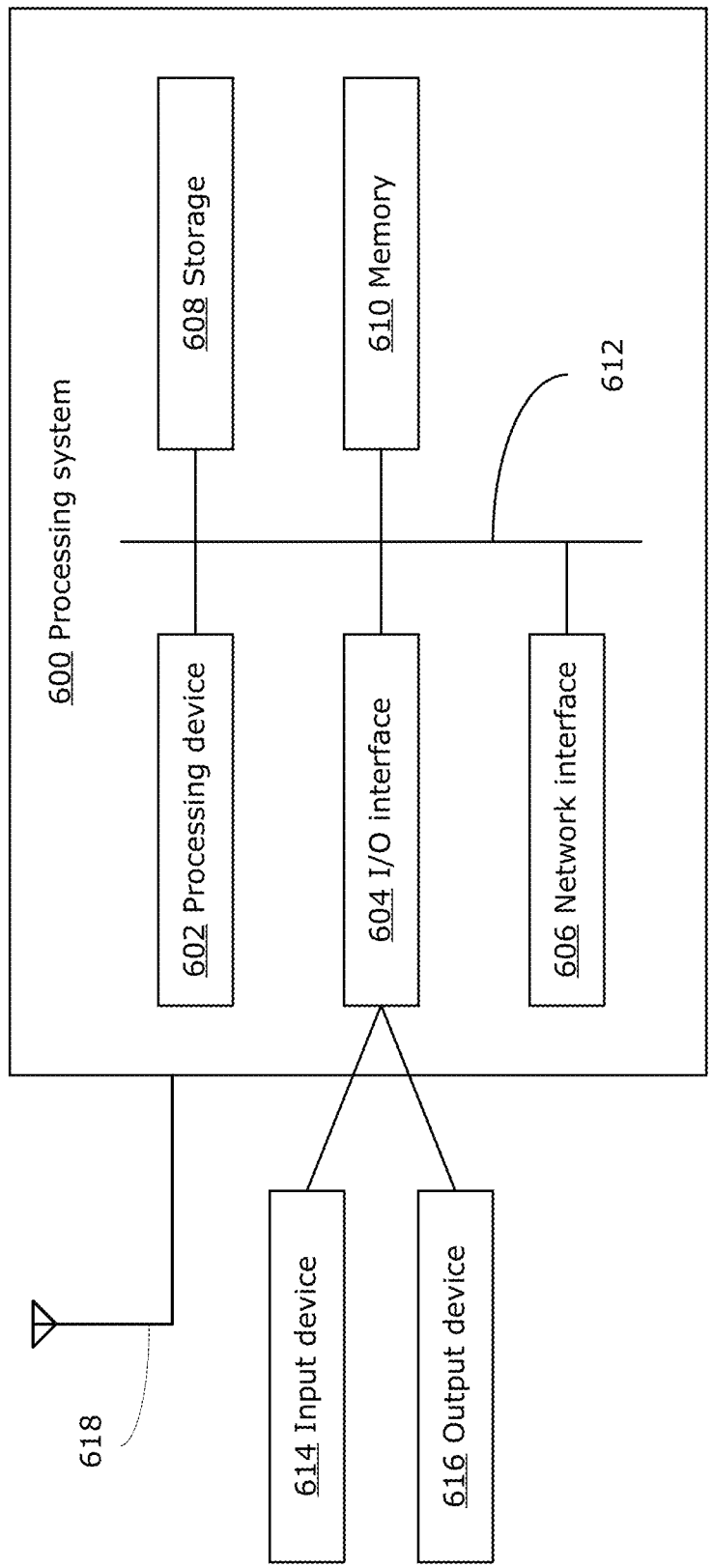
FIG. 6 is a block diagram of an example simplified processing system, which may be used to implement embodiments disclosed herein.

FIG. 6 is a block diagram of an example simplified processing system 600, which may be used to implement embodiments disclosed herein, and provides a higher level implementation example. The apparatus 400, the apparatus 500, or both, may be implemented using the example processing system 600, or variations of the processing system 600. The processing system 600 could be a server or a mobile device, for example, or any suitable processing system. Other processing systems suitable for implementing embodiments described in the present disclosure may be used, which may include components different from those discussed below. Although FIG. 6 shows a single instance of each component, there may be multiple instances of each component in the processing system 600.

The processing system 600 may include one or more processing devices 602, such as a processor, a microprocessor, an application-specific integrated circuit (ASIC), a field-programmable gate array (FPGA), a dedicated logic circuitry, or combinations thereof. The processing system 600 may also include one or more input/output (I/O) interfaces 604, which may enable interfacing with one or more appropriate input devices 614 and/or output devices 616. The processing system 600 may include one or more network interfaces 606 for wired or wireless communication with a network (e.g., an intranet, the Internet, a P2P network, a WAN and/or a LAN) or other node. The network interfaces 606 may include wired links (e.g., Ethernet cable) and/or wireless links (e.g., one or more antennas) for intra-network and/or inter-network communications. The network interfaces 606 may provide wireless communication via one or more transmitters or transmit antennas and one or more receivers or receive antennas, for example. In this example, a single antenna 618 is shown, which may serve as both transmitter and receiver. However, in other examples there may be separate antennas for transmitting and receiving. In some examples, there may be multiple antennas 618 that together form an antenna array, in which case each antenna 618 may be referred to as an antenna element or radiating element of the antenna array. There may be a plurality of such antenna arrays.

The processing system 600 may also include one or more storage units 608, which may include a mass storage unit such as a solid state drive, a hard disk drive, a magnetic disk drive and/or an optical disk drive. The processing system 600 may include one or more memories 610, which may include a volatile or non-volatile memory (e.g., a flash memory, a random access memory (RAM), and/or a read-only memory (ROM)). The non-transitory memory(ies) 610 may store instructions for execution by the processing device(s) 602, such as to carry out examples described in the present disclosure, for example to perform encoding or decoding. The memory(ies) 610 may include other software instructions, such as for implementing an operating system and other applications/functions. In some examples, one or more data sets and/or modules may be provided by an external memory (e.g., an external drive in wired or wireless communication with the processing system 600) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 612 providing communication among components of the processing system 600, including the processing device(s) 602, I/O interface(s) 604, network interface(s) 606, storage unit(s) 608 and/or memory(ies) 610. The bus 612 may be any suitable bus architecture including, for example, a memory bus, a peripheral bus or a video bus.

In FIG. 6, the input device(s) 614 (e.g., a keyboard, a mouse, a microphone, a touchscreen, and/or a keypad) and output device(s) 616 (e.g., a display, a speaker and/or a printer) are shown as external to the processing system 600. In other examples, one or more of the input device(s) 614 and/or the output device(s) 616 may be included as a component of the processing system 600. In other examples, there may not be any input device(s) 614 and output device(s) 616, in which case the I/O interface(s) 604 may not be needed.

As discussed above, information bits, frozen bits and assistant bits are transmitted over sub-channels. Some sub-channels may have higher capacity, and some sub-channels may have lower capacity. Put another way, some sub-channels may have higher Signal-to-Noise Ratio (SNR) and others may have lower SNR. These metrics are examples of characteristics that may be used to quantify or classify the "reliability" of a sub-channel. A step in code construction is to compute the reliabilities for the sub-channels, and then select the sub-channels with sufficient reliability for information bits and assistant bits.

The sub-channels over which information bits are transmitted may be referred to as information sub-channels; the sub-channels over which frozen bits are transmitted may be referred to as frozen sub-channels; and the sub-channels over which assistant bits are transmitted may be referred to as assistant sub-channels. In some examples, assistant sub-channels may be selected after all of the information sub-channels have been selected. In some examples, the assistant sub-channels may be selected from the frozen sub-channel space, for example from sub-channels that normally would be used for frozen bits.

The assistant sub-channels may be scattered over the entire sub-channel space, which may provide better performance, or occupy at least some consecutive sub-channel positions. In some examples, the first assistant sub-channels follow one or more information sub-channels, because a decoder (e.g., a successive cancellation decoder) typically processes the information bits first, and then decodes assistant bits to assist in decoding the previously processed information bits. Distribution of the assistant sub-channels and the information sub-channels may be performed in such a way as to enable ET earlier, or as early as possible, during decoding.

Figure 7:
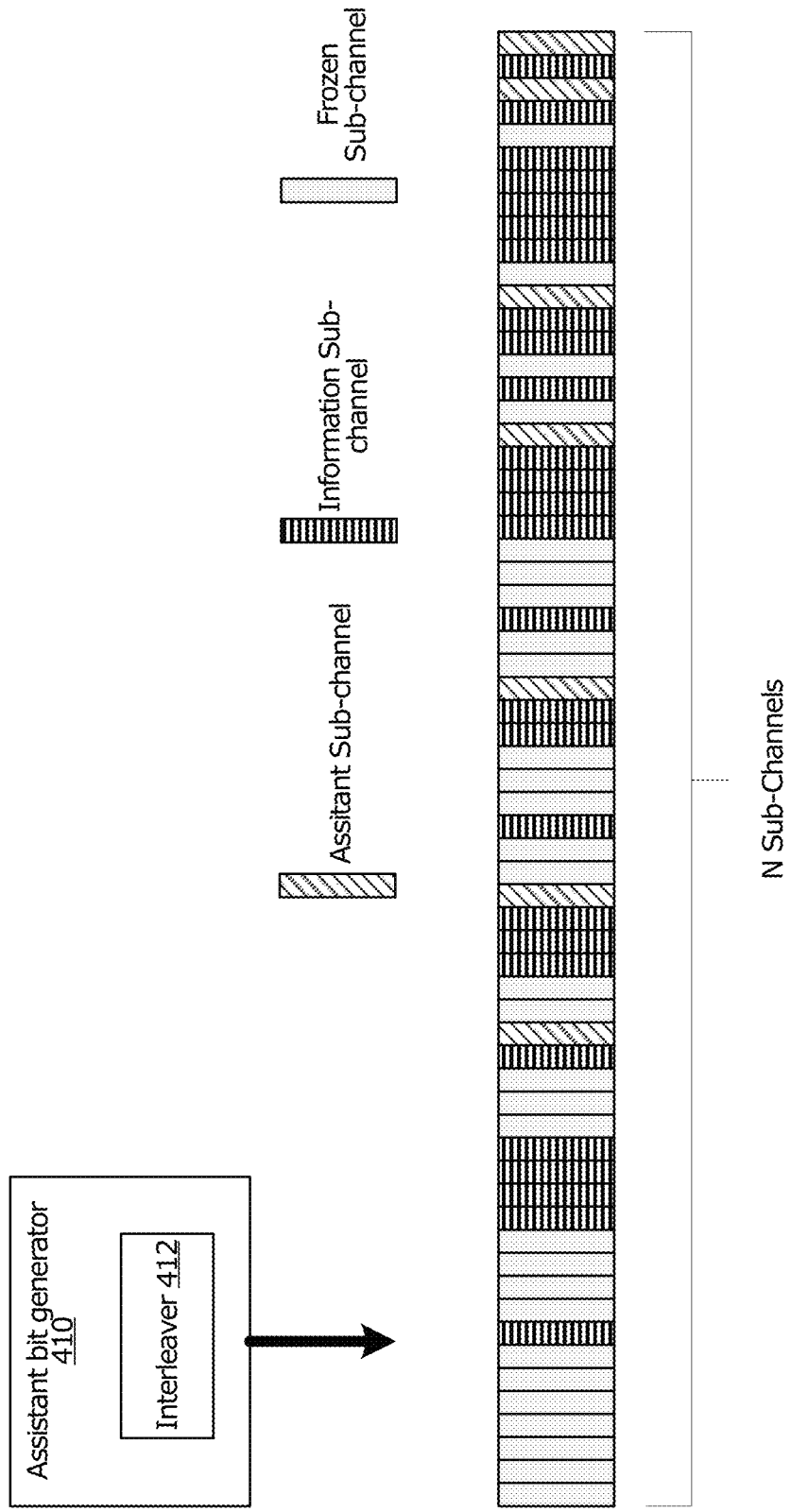
FIG. 7 is a block diagram illustrating an example of how bits are placed on sub-channels.

FIG. 7 is a block diagram illustrating an example of assistant bit generation and assistant sub-channel allocation. In the example of FIG. 7, the assistant bit generator 410 includes an interleaver 412 for interleaving information bits and assistant bits, as discussed further below, so as to distribute the bits in the sub-channels. Although the interleaver 412 is illustrates as a distinct component within the assistant bit generator 410, in some examples the functions of the interleaver 412 may be performed by the assistant bit generator 410 or the encoder 404 generally.

According to a process that is known or otherwise distributed to an encoder and a decoder, the assistant bit generator 410 generates an assistant bit from a set of relevant information bits. Multiple assistant bits could be generated from different respective sets of relevant information bits. The generated assistant bits are interleaved with the information bits by the interleaver 412, and the interleaved information and assistant bits may be distributed among the information sub-channels and the frozen sub-channels. In some examples, two or more assistant sub-channels may be adjacent to each other. Typically, both an encoder and a decoder will produce or use the same sub-channel allocation pattern so that the encoded information can be properly decoded.

As described above, a sequential decoder (e.g., as in the case of a polar code decoder) may terminate decoding when it encounters a failure event, without completing decoding of the entire received codeword. Thus, interleaving the assistant bits and the information bits may enable ET, that is the decoder may terminate as soon as parity check on an assistant bit fails, without having to wait until the end of the codeword to perform check on the assistant bits.

Placing the assistant bits as early as possible in the sequence of the input vector to be encoded may allow ET to be decided as early as possible, resulting in further decoding efficiencies. Therefore, the assistant bit may preferably be placed immediately following an information bit that completes the set of relevant information bits for that particular assistant bit.

However, in some cases the particular assistant bit may not be placed immediately following the last information bit that completes the set of relevant information bits. For example, a frozen bit may be placed between the last information bit and the particular assistant bit. In another example, another assistant bit may be placed between the last information bit and the particular assistant bit.

Generally, the relevant information bits for a given assistant bit may be a subset of all information bits in the information vector. To properly distribute and allocate the assistant bits among the sub-channels, it is necessary to know the set of relevant information bits for each respective assistant bit. The relevant information bits for each assistant bit may be identified by the PC equations used to generate the assistant bits from the information bits. In PC-polar codes, and FEC codes more generally, different performance aspects (e.g., power consumption) depend on the selection of sub-channels and the PC equations that are used to generate the assistant bits from the information bits.

CRC bits, for example, are generated based on the information bits being transmitted according to an algorithm represented by a CRC generator polynomial. In general, however, other types of assistant bits may also be generated and expressed by a corresponding polynomial. Although embodiments of the present disclosure are not limited to CRC bits, specific examples may refer to CRC bits and CRC polynomials because CRC polynomials are popular and widely adopted. CRC bits are generally placed in the more reliable positions in the input vector, although CRC bits may also be placed in other positions in the input vector. CRC bits may be used in path selection for List decoding, for example, to improve decoder performance.

With CRC codes, the $1 \times K$ information vector $a_{1 \times K}$ is appended with m assistant bits, in this case CRC bits crc(a), to give [a,crc(a)]. The entries of this vector are then distributed or sorted over the sub-channels. Once a sub-channel allocation is fixed, the resultant coding scheme can be considered as a distributed parity check (DPC) polar code. The transform from a to [a,crc(a)] is a linear transform and the bits crc(a) are linear combinations of the information bits a.

A PC matrix may be used to relate the information bits to the assistant bits. Assistant bits may then be generated by applying the PC matrix to the information bits. The PC matrix may thus define the relevant information bits that are used to generate each assistant bit.

Where a PC polynomial (e.g., a CRC polynomial) is used, the PC matrix may be calculated from a PC polynomial, for example as described in U.S. provisional patent application No. 62/475,625, filed Mar. 23, 2017 and hereby incorporated by reference in its entirety.

The PC matrix P contains the PC equations relating the assistant bits to the information bits. Each column of P defines the set of relevant information bits for one assistant bit; in other words, each column of P defines a PC equation for one assistant bit. It should be noted that the number of rows of P is dependent on and equal to the length K of the information vector for which the assistant bits are being generated.

Figure 8:
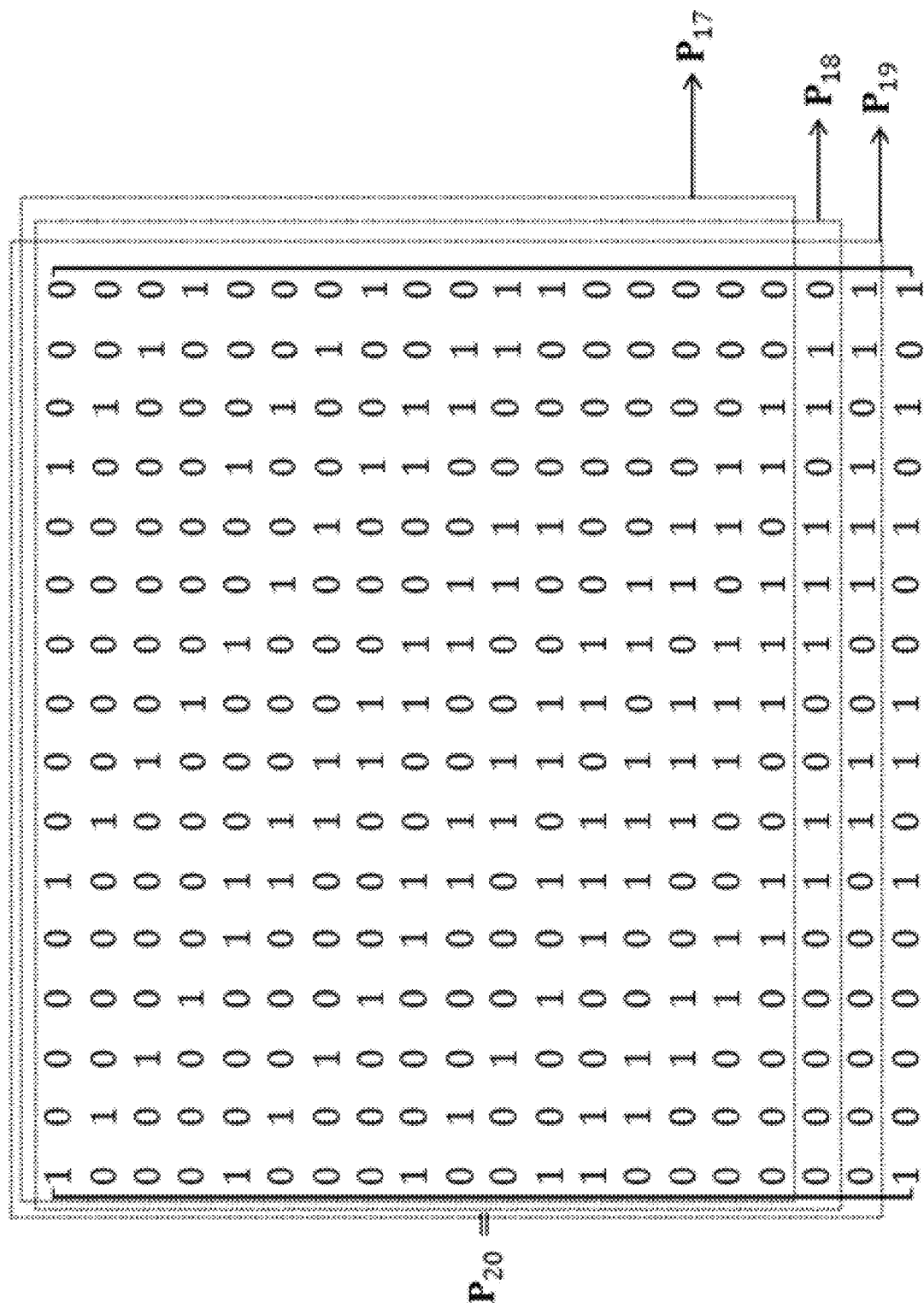
FIG. 8 illustrates an example parity check matrix having a nested property.

An example PC matrix $P_{20}$ having 20 rows is shown in FIG. 8. $P_{20}$ may be used to generate the assistant bits for an information vector having length K=20.

The PC matrix may exhibit a nested property. This means that $P_K$ contains all PC matrices for information vectors of length K or less. That is, $P_K$ contains all $P_{K'}$, K'<K. For example, as shown in FIG. 8, $P_{17}$ can be determined by taking the first 17 rows of $P_{20}$. Similarly, $P_{18}$ and $P_{19}$ can be determined by taking the first 18 and 19 rows, respectively, of $P_{20}$.

In an encoder (e.g., as found in the example apparatus 400 of FIG. 4), the PC matrix P may be calculated on demand, for example for each codeword encoded using a CRC code. Additionally or alternatively, the PC matrix P may be calculated beforehand (whether by the encoder or by some other system) and the calculated PC matrix P may be stored (e.g., in a memory or storage device internal or external to the encoder) and accessed by the encoder.

In some examples, where P has a nested property, the stored PC matrix P may be sized according to the maximum length of the information vectors inputted to the encoder (e.g., as defined by a standard). For example, if the maximum length of information vectors is 16 bits, the stored PC matrix may be $P_{16}$ having 16 rows. Because of the nested property of P, $P_1$ to $P_{15}$ (used to generate assistant bits for information vectors of length 1-bit to length 15-bits) may be determined simply by taking the appropriate number of rows from $P_{16}$.

A method for selecting the order for placing information bits and assistant bits over the sub-channels is now described. In the method described below, the assistant bits are interleaved among the information bits in such a way as to enable ET earlier, or as early as possible, in decoding. It should be noted that not only are the information and assistant bits interleaved with each other, but also the order of the information bits and assistant bits may be shuffled so as to enable earlier ET. In examples described below, methods are provided for interleaving and ordering the information and assistant bits. Such methods are provided for the purpose of illustration only and are not intended to be limiting. Such methods may aim to optimize placement of information and assistant bits, so as to enable termination as early as possible in decoding. However, it should be understood that in some cases the placement of information and assistant bits may not be strictly optimal. For example, there may be trade-offs for decreasing processing power or for better computational efficiency.

Consider m assistant bits $c_0, c_1, \ldots, c_{m-1}$ generated from the K-length information vector $a_0, a_1, \ldots, a_{K-1}$. The K+m information and assistant bits are to be transmitted using a polar code of length $N=2^n$ with an information set of size K+m by mapping them to K+m information sub-channels with the largest reliabilities. For each assistant bit $c_i$, the set of indices of the respective relevant information bits is denoted as $R_i$. That is $R_i = \{k | p_{k,i}=1\}$, where $p_{k,i}$ is the element of P located at row k and column i ($0 \le k < K$, $0 \le i < m$). That is, the indices of the relevant information bits for assistant bit $c_i$ are identified by the non-zero entries in the i-th column of the PC matrix P.

A particular assistant bit can be checked only after all of its relevant information bits have been decoded. To increase the possibility and advantages of ET, the particular assistant bit should be placed immediately after or soon after its relevant information bits. Further, it would also be useful for the number of relevant information bits needed for checking each assistant bit to be small, so ET can occur as early as possible. In the following examples, the K+m information and assistant bits are interleaved and reordered to obtain an interleaved sequence. The bits can then be placed on the information sub-channels in natural order according to the interleaved sequence. In the present disclosure, natural order may mean the order of polar code sub-channels from lowest index to highest index.

In the examples described below, the m assistant bits are interleaved with the information bits and each assistant bit is placed as close as possible (e.g., immediately) after the respective relevant information bits. In some cases, an assistant bit may be placed following, but not immediately after, the respective relevant information bits.

The interleaved sequence of information and assistant bits may be constructed by first determining which assistant bit, among all assistant bits, has the smallest number of associated relevant information bits. This will be the first assistant bit, which is placed immediately after the respective set of relevant information bits. The next assistant bit to be placed is the assistant bit, among all remaining assistant bits, that depends on the smallest number of additional information bits. The additional information bits for this next assistant bit is placed, and the next assistant bit is placed immediately afterwards. This process is continued until all information bits and assistant bits have been placed. The result is an interleaved sequence in which the number of information bits needed between assistant bits is minimized. This means that the assistant bits are placed as early as possible, thus increasing the possibility of earlier ET.

The following describes the above process mathematically. The interleaved sequence may be represented as $a_{D_1}, c_{t_1}, a_{D_2}, c_{t_2}, \ldots, a_{D_m}, c_{t_m}$, where $t_1 \ldots t_m$ is the index of the assistant bits in the interleaved sequence, and $D_i$ is defined as $D_1 = R_{t_1}$, and $D_j = R_{t_j} \setminus \{\cup_{k<j} D_k\}$ for $j>1$. That is, in the interleaved sequence, the information and assistant bits are placed according to an interleaving order $D_1, t_1, D_2, t_2, \ldots, D_m, t_m$, which defines the index order for interleaving the information and assistant bits.

$D_1$ is the set of indices of the relevant information bits (also referred to as the index of the relevant information set) of the first assistant bit $c_{t_1}$ in the interleaved sequence, and $D_2$ is the index of the relevant information set of the second assistant bit $c_{t_2}$, excluding those information bits which are already included in $D_1$. $D_3$ is the index of the relevant information set of the third CRC bit $c_{t_3}$, excluding those information bits which are already included in $D_1$ or $D_2$, and so on.

As an example, consider the following example PC matrix for K=8 and m=4:

$$P = \begin{bmatrix} 1 & 1 & 1 & 1 \\ 1 & 0 & 0 & 0 \\ 0 & 1 & 0 & 0 \\ 0 & 0 & 1 & 0 \\ 0 & 0 & 0 & 1 \\ 1 & 1 & 1 & 1 \\ 1 & 0 & 0 & 0 \\ 0 & 1 & 0 & 0 \end{bmatrix}$$

The relevant information sets for each assistant bit may be found by identifying the non-zero entries in each column of the PC matrix. In this case, the relevant information sets are $R_0=\{0,1,5,6\}$, $R_1=\{0,2,5,7\}$, $R_2=\{0,3,5\}$ and $R_3=\{0,4,5\}$. Consider an arbitrary, non-optimized order for the 4 assistant bits as $c_2, c_0, c_1, c_3$. Then the vector of interleaved information and assistant bits will be: $a_0, a_3, a_5, c_2, a_1, a_6, c_0, a_2, a_7, c_1, a_4, c_3$ where:

$D_1 = R_2 = \{0,3,5\}$ $D_2 = R_0 \setminus D_1 = \{0,1,5,6\} \setminus \{0,3,5\} = \{1,6\}$ $D_3 = R_1 \setminus \{D_1 \cup D_2\} = \{0,2,5,7\} \setminus \{0,1,3,5,6\} = \{2,7\}$ $D_4 = R_3 \setminus \{D_1 \cup D_2 \cup D_3\} = \{0,4,5\} \setminus \{0,1,2,3,5,6,7\} = \{4\}$ Let $d_i$ denote the number of elements in the set $D_i$. In other words, $d_1$ is the number of information bits required to be decoded before the first assistant bit $c_{t_1}$ in the interleaved sequence is reached and the first point at which ET is possible. $d_2$ is the number of information bits that needs to be decoded between $c_{t_1}$ and the second assistant bit $c_{t_2}$ in the interleaved sequence, which is the second point at which ET is possible, and so on. In the above example, the result is $d=(d_1, d_2, d_3, d_4)=(3,2,2,1)$ To achieve ET earlier, interleavers for distributing a given set of assistant bits and information bits may be ranked as follows. An interleaver that achieves smaller $d_1$ is preferable over other interleavers with larger $d_1$. Among all interleavers achieving equally small $d_1$, those that achieve smaller $d_2$ are preferable. Among all interleavers achieving equally small $d_1$ and $d_2$, those that achieve smaller $d_3$ are preferable, and so on. In other words, to rank two interleavers for a given set of information and assistant bits, the $d_1$ achieved by each interleaver is compared, and whichever interleaver achieves the smaller $d_1$ is ranked higher. If both interleavers achieve the same $d_1$, the comparison is performed for $d_2$ of both interleavers, and again the interleaver achieving the smaller value is ranked higher. This comparison may be continued for all $d_i$, until the better interleaver is identified. It should be noted that it is possible for two different interleavers to have all $d_i$ values equal, in which case either interleaver may be selected for distributing the information and assistant bits. A rule may be implemented for selecting one interleaver where two interleavers have all $d_i$ values equal. For example, a rule may specify that it is preferable to place an information bit or an assistant bit with a lower index earlier in the interleaved sequence. This may help to clearly define the interleaver for both the transmitting device and the receiving device. As well, this approach is more likely to result in an interleaver that requires less reordering of information and assistant bits, which may result in less use of processing resources. However, generally, where two interleavers have all $d_i$ values equal, selection of either interleaver is not expected to have a significant effect in terms of ET.

Figure 9:
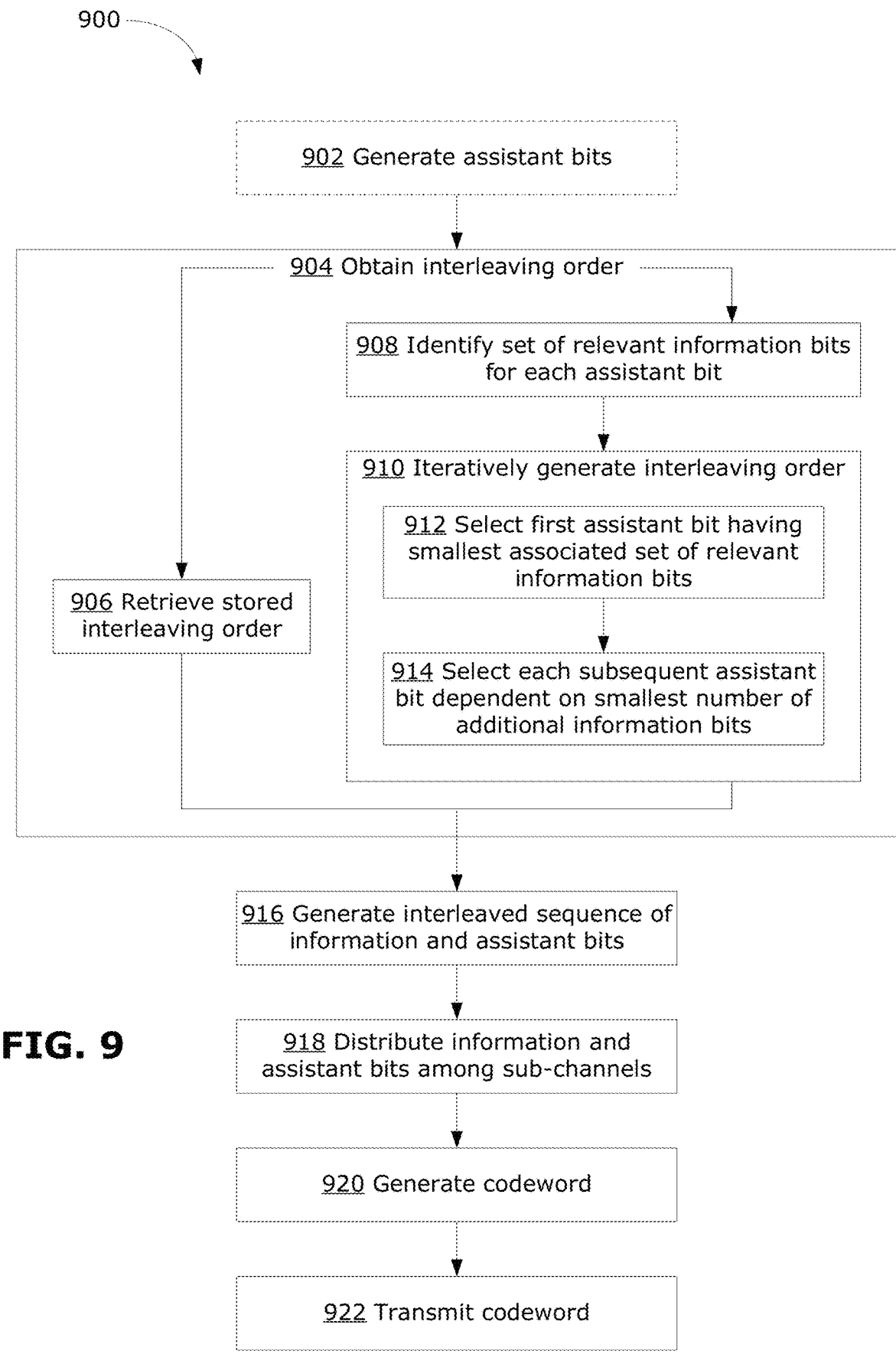
FIG. 9 is a flowchart illustrating an example method for distributing information and assistant bits.

FIG. 9 is a flowchart illustrating an example method 900 for interleaving and distributing the information and assistant bits.

In the following description, it is assumed that a given input information vector has K information bits $a_0$, $a_1, \ldots, a_{K-1}$ and m assistant bits $c_0, c_1, \ldots, c_{m-1}$ are generated from the PC matrix. In some examples, the PC matrix may be calculated from a polynomial, such as a CRC polynomial. The example method 900 receives these K+m information and assistant bits and provides a K+m length interleaving sequence. This is used by the interleaver to generate an interleaved sequence of K+m bits. Transmission indices $(t_1, t_2, \ldots, t_m)$ are used to re-index the assistant bits in the interleaved sequence, indicating that $c_{t_1}$ is placed before $c_{t_2}$, and so on. $R_i$ is the set of indices of all relevant information bits for assistant bit $c_i$.

At 902, optionally, the assistant bits are generated from the inputted information vector. This may involve applying a PC matrix to the information vector, for example. In some examples, the PC matrix may be calculated from a generator polynomial.

At 904, an interleaving order for interleaving the information and assistant bits is obtained.

In examples where the interleaving order is calculated ahead of time, the previously calculated and stored interleaving order is retrieved at 906. This may avoid the need to recalculate the interleaving order each time, and may help to save processing resources. The same stored interleaving order may be used as long as the PC matrix is unchanged. The stored interleaving order may be calculated for a particular length of information vector. An example method for modifying the stored interleaving order for different lengths of information vectors is described further below. After retrieving the stored interleaving order, the method 900 proceeds to 916.

Alternative to 906, the interleaving order may be calculated by proceeding to 908.

At 908, the associated set of relevant information bits is identified for each assistant bit.

At 910, the interleaving order is iteratively generated.

At 912, the assistant bit that should occur first (i.e., $c_{t_1}$) in the interleaved sequence is identified by selecting the assistant bit, among all assistant bits, having the smallest associated set of associated relevant information bits. If two or more assistant bits have equally small associated sets of relevant information bits, a selection may be made based on an arbitrary rule (e.g., selecting the lower indexed assistant bit). $t_1$ is set to be the index of the selected assistant bit, and $D_1$ is set to be the indices of the relevant information bits associated with the selected assistant bit.

At 914, each subsequent assistant bit in the interleaved sequence is selected iteratively. Among the remaining assistant bits, the next assistant bit is selected as the assistant bit that is dependent on the smallest number of information bits in addition to those already indexed in D. If two or more assistant bits are dependent on equally small numbers of additional information bits, a selection may be made based on an arbitrary rule (e.g., selecting the lower indexed assistant bit). The index of the selected assistant bit is added to the list of transmission indices $t_i$ and the associated additional information bits is added as $D_i$.

In this way, $(t_1, t_2, \ldots, t_m)$ and $(D_1, D_2, \ldots, D_m)$ are generated. It should be noted that some $D_i$ may be empty sets. The interleaving order is then obtained as $D_1, t_1, D_2, t_2, \ldots, D_m, t_m$. The generated interleaving order may be stored (e.g., in a memory accessible by the interleaver 412 or by the encoder 404 generally) so that it may be retrieved at 906 in a future instance of the method 900.

The method 900 proceeds to 916.

At 916, the interleaved sequence of information and assistant bits is generated by placing the information and assistant bits according to the index order indicated by the interleaving order. In some examples, 916 may be performed in parallel with 904, for example by placing bits in the interleaved sequence as soon as each entry in the interleaving order is obtained.

At 918, the information and assistant bits are distributed over the sub-channels in accordance with the interleaved sequence. The information and assistant bits of the interleaved sequence are placed in natural order—that is, the first bit in the interleaved sequence is placed in the sub-channel with the smallest index, the second bit in the interleaved sequence is placed in the sub-channel with the second smallest index, and so forth. In some examples, 918 may be performed in parallel with 916, for example by placing bits on the sub-channels as soon as each entry in the interleaved sequence is obtained. The result of this distribution is an input vector in which the assistant bits are with properly distributed among the information bits. Although not discussed in detail, the frozen bits may also be distributed among the information and assistant bits on the sub-channels.

At 920, the input bits placed on the sub-channels are encoded to generate a codeword.

At 922, the codeword is transmitted, for example using a transmitter coupled to the encoder.

In some examples, the method 900 may be performed by a transmitting ED, for example the apparatus 400 of FIG. 4, using the encoder 404, for example using the assistant bit generator 410 and interleaver 412. In some examples, a portion of the method 900 may be performed elsewhere, for example a separate device may perform 908 to 914 to calculate the interleaving order and the pre-calculated interleaving order may be stored by the transmitting ED. The remainder of the method 900 may be completed by the transmitting ED. In some examples, 908 to 914 may be performed by the transmitting ED before any bits are to be placed on the sub-channels, and the pre-calculated interleaving order may be stored (e.g., in a memory coupled to or otherwise accessible by the encoder). The interleaver 412 may then use the stored interleaving order to generate the interleaved sequence at 916. The interleaving order that is used by the encoder of the transmitting ED is also known by the decoder of the receiving ED (e.g., as illustrated in the apparatus 500 of FIG. 5), to enable the decoding to take advantage of the possibility for ET. For example, the interleaving order may be calculated by the transmitting ED or other device (e.g., where the interleaving order is pre-calculated by a device other than the transmitting ED) and programmed into or otherwise communicated to the receiving ED.

908 to 914 may be expressed in pseudo code as follows:

Receive as input the information bits $a_0, a_1, \ldots, a_{K-1}$ and assistant bits $c_0, c_1, \ldots, c_{m-1}$. Alternatively, receive the information vector and PC matrix, and generate the assistant bits by applying the PC matrix to the information vector. Further alternatively, receive a generator polynomial and calculate the PC matrix from the polynomial The transmission order of the assistant bits is $(t_1, t_2, \ldots, t_m)$ Initialize:

$$R^{total} \leftarrow \{\,\}$$
$$\text{UndecidedBit} \leftarrow \{0, \ldots, m-1\}$$

Find the set of relevant $R_i$ info bits for each assistant bit $c_i$ iteratively:

```
For i ∈ {0,...,m - 1}
|
|_ R_i ← {k | p_{k,i} = 1}     // identify the set of relevant
                                // information bits for each
                                // assistant bit
```

Find the interleaving order iteratively:

```
For k ∈ {0,...,m - 1}
|
|   i* = argmin_{i∈UndecidedBit}|R_i \R^total|
|
|   t_k ← i*
|
|   UndecidedBit← UndecidedBit \i*
|
|   D_k = R_{i*} \R^total
|
|_  R^total ← R^total ∪ R_{i*}    // calculating the set of information
                                    // bits coming before c_{tk}
```

The interleaved sequence can then be generated by interleaving the information and assistant bits according to the $t_k$ and $D_k$ calculated.

In some examples, the interleaving of information and assistant bits may be performed as part of the generation of assistant bits using the assistant bit generator 410.

Example implementations of the disclosed interleaving approach are now discussed.

In an example, consider again the above-discussed PC matrix for K=8 and m=4:

$$P = \begin{bmatrix} 1 & 1 & 1 & 1 \\ 1 & 0 & 0 & 0 \\ 0 & 1 & 0 & 0 \\ 0 & 0 & 1 & 0 \\ 0 & 0 & 0 & 1 \\ 1 & 1 & 1 & 1 \\ 1 & 0 & 0 & 0 \\ 0 & 1 & 0 & 0 \end{bmatrix}$$

As before, the relevant information sets for each assistant bit may be found by identifying the non-zero entries in each column of the PC matrix. In this case, the relevant information sets are $R_0=\{0,1,5,6\}$, $R_1=\{0,2,5,7\}$, $R_2=\{0,3,5\}$ and $R_3=\{0,4,5\}$.

In accordance with the method 900, $c_2$ or $c_3$ can be selected as the first assistant bit $c_{t_1}$ in the interleaving order, because both $c_2$ and $c_3$ have 3 relevant information bits. In this example, $c_3$ is arbitrarily selected as $c_{t_1}$, so $t_1=3$ and $R^{total}=\{0,4,5\}$. Next, $c_{t_2}$ is selected such that $D_2$ is minimized. Because only one new information bit (namely, $a_3$) needs to be added to cover $R_2$, $t_2=2$ is selected and $R^{total}$ becomes $R^{total}=\{0,3,4,5\}$. The next assistant bit $c_{t_3}$ is chosen from the remaining assistant bits $c_0$ and $c_1$, whichever is associated with the smallest number of relevant information bits that are not yet included in $R^{total}=\{0,3,4,5\}$. $c_0$ is associated with relevant information bits $a_0, a_1, a_5, a_6$ among which only two bits $a_1$ and $a_6$ have not yet been included in $R^{total}$. $c_1$ is associated with relevant information bits $a_0, a_2, a_5, a_7$ among which only two bits $a_2$ and $a_7$ have not yet been included in $R^{total}$. So selecting either $c_0$ and $c_1$ as $c_{t_3}$ results in the same $D_3$. $c_0$ may be selected arbitrarily for $c_{t_3}$, so $t_3=0$ and $t_4=1$. The result is $(t_1, t_2, t_3, t_4)=(3,2,0,1)$ and $D_1=\{0,4,5\}$ $D_2=\{0,3,5\}\backslash\{0,4,5\}=\{3\}$ $D_3=\{0,1,5,6\}\backslash\{0,3,4,5\}=\{1,6\}$ $D_4=\{0,2,5,7\}\backslash\{0,1,3,4,5,6\}=\{2,7\}$ Then the interleaved sequence is $a_0, a_4, a_5, c_3, a_3, c_2, a_1, a_6, c_0, a_2, a_7, c_1$ and $d=(d_1, d_2, d_3, d_4)=(3,1,2,2)$. That is, there are 3 information bits to decode before reaching the first assistant bit, 1 information bit between the first and second assistant bits, 2 information bits between the second and the third assistant bits, and 2 information bits between the third and fourth assistant bits. It should be noted that the order of the information bits within each $D_i$ may be varied.

Comparing the above result to the previous arbitrary interleaving for the same PC matrix, it can be appreciated that using the disclosed method achieves an interleaved sequence that provides earlier possible ET.

In another example, K=10 and m=8, with the PC matrix as follows:

$$P = \begin{bmatrix} 1 & 1 & 1 & 0 & 1 & 0 & 1 & 0 \\ 0 & 1 & 1 & 1 & 0 & 1 & 0 & 1 \\ 1 & 1 & 0 & 1 & 0 & 0 & 0 & 0 \\ 0 & 1 & 1 & 0 & 1 & 0 & 0 & 0 \\ 0 & 0 & 1 & 1 & 0 & 1 & 0 & 0 \\ 0 & 0 & 0 & 1 & 1 & 0 & 1 & 0 \\ 0 & 0 & 0 & 0 & 1 & 1 & 0 & 1 \\ 1 & 1 & 1 & 0 & 1 & 1 & 0 & 0 \\ 0 & 1 & 1 & 1 & 0 & 1 & 1 & 0 \\ 0 & 0 & 1 & 1 & 1 & 0 & 1 & 1 \end{bmatrix}$$

In accordance with the method 900, the assistant bits are ordered as $(t_1, t_2, t_3, t_4, t_5, t_6, t_7, t_8) = (7,0,6,3,5,2,1,4)$. The interleaved sequence is $a_1, a_6, a_9, c_7, a_0, a_2, a_7, c_0, a_5, a_8, c_6, a_4, c_3, c_5, a_3, c_2, c_1, c_4$ and $d=(3,3,2,1,0,1,0,0)$. It should be noted that in this example interleaved sequence is not a unique result from the method 900. For example, $c_3$ and $c_5$ may switch positions because no additional information bit is required between these two assistant bits. As well, the order of the information bits may be changed within each $D_j$, for example $a_1$ and $a_6$ may switch positions. Further, it should be noted that the assistant bits are not necessarily placed immediately following the last information bit in its associated set of relevant information bits. For example, $c_5$ is placed following $c_3$.

By using the disclosed example method, the information and assistant bits are interleaved such that the assistant bits are placed earlier in the sub-channels, to enable the possibility of earlier ET. Table 1 below shows the resulting d of the disclosed example method, compared against a conventional approach in which the information bits remain in their original order (i.e., $a_0, a_1, \ldots, a_{K-1}$) and the assistant bits are placed after the last information bit in the respective sets of relevant information bits. In Table 1, the PC matrices for generating the assistant bits are calculated from the CRC polynomials $g(x)=1+x^2+x^4+x^6+x^7+x^8$ for $m=8$ and $g(x)=1+x^5+x^{12}+x^{16}$ for $m=16$.

TABLE 1

| K | m | d of disclosed method | d of conventional approach |
|---|---|---|---|
| 100 | 8 | (49, 17, 16, 9, 4, 3, 1, 1) | (49, 25, 12, 7, 4, 1, 1, 1) |
| 400 | 8 | (195, 68, 68, 34, 18, 9, 4, 4) | (202, 101, 47, 25, 13, 4, 4) |
| 100 | 16 | (40, 21, 14, 10, 4, 4, 1, 2, 1, 1, 1, 0, 0, 1, 0, 0) | (44, 20, 16, 10, 3, 5, 0, 1, 1, 0, 0, 0, 0, 0, 0, 0) |

As can be appreciated from a comparison of d, the disclosed example method results in placement of the assistant bits at earlier sub-channels to enable the possibility of earlier ET.

As discussed earlier, the PC matrix may exhibit a nested property, for example as described in previously noted U.S. provisional patent application No. 62/475,625. As illustrated by the example shown in FIG. 8, this means that a given PC matrix $P_K$ having K rows contains all PC matrices for information vectors of length K or less. That is, $P_K$ contains all $P_{K'}$, $K'<K$. Any $P_{K'}$ can be obtained from $P_K$ taking only the first K' rows of $P_K$. For example, as shown in FIG. 8, $P_{17}$ can be determined by taking the first 17 rows of $P_{20}$. Similarly, $P_{18}$ and $P_{19}$ can be determined by taking the first 18 and 19 rows, respectively, of $P_{20}$. This nested property of the PC matrix may be used to reduce the use of computing resources when interleaving the information and assistant bits.

The encoder typically receives information vectors of different lengths. To prevent the need to calculate and/or store interleaving orders for all different possible lengths of information vectors, a single interleaving order can instead be calculated and stored for $K_{max}$ for a given PC matrix $P_{K_{max}}$, where $K_{max}$ is the greatest length of information vector expected or permitted (e.g., in accordance with a standard). The result is a stored interleaving order of length $K_{max}+m$. Then, because of the nested property of the PC matrix, the interleaving order for any information vector having length $K<K_{max}$ can be obtained by removing $a_K, a_{K+1}, \ldots, a_{Kmax-1}$ from the stored interleaving order. For example, if the interleaving order for $K=10$ and $m=8$ is $a_1, a_6, a_9, c_7, a_0, a_2, a_7, c_0, a_5, a_8, c_6, a_4, c_3, c_5, a_3, c_2, c_1, c_4$, then the interleaving order for $K=8$ and $m=8$ (assuming the same PC matrix) can be obtained by removing $a_8$ and $a_9$, resulting in the interleaving order $a_1, a_6, c_7, a_0, a_2, a_7, c_0, a_5, c_6, a_4, c_3, c_5, a_3, c_2, c_1, c_4$.

Generally, when the stored interleaving order includes one or more higher index information bits with a higher index than the information bits inputted to the encoder, the interleaving order to be used with the inputted information bits can be obtained by removing the higher index information bits from the stored interleaving order to generate a shortened interleaving order.

It should be noted that the shortened interleaving order generated in this way may be sub-optimal (i.e., the information and assistant bits may not be placed for earliest possible ET). However, generally this approach is expected to achieve an interleaving order that is still improved over conventional approaches. Thus, there may be a tradeoff between computational efficiency and optimal interleaving of information and assistant bits.

In some examples, there may be multiple stored interleaving orders, calculated for the same PC matrix but for different values of K. For example, a first interleaving order may be calculated and stored for the maximum K permitted by a standard, and a second interleaving order may be calculated and stored for an expected maximum K to cover most expected input vectors. It should be noted that, for the same PC matrix, the number of assistant bits m generated is the same regardless of the value of K.

By selecting a stored interleaving order calculated for a K that is close to the actual length of the inputted information vector, and generating the shortened interleaving order from that selected stored interleaving order, the shortened interleaving order is expected to be closer to optimal. For example, if there are two stored interleaving orders for $K=100$ and $K=50$, when the inputted information vector is of length 48, the stored interleaving order for $K=50$ should be used to generate the shortened interleaving order. Because the shortened interleaving order is closer to the optimized interleaving order calculated for $K=50$, the shortened interleaving order is expected to be closer to optimal.

Figure 10:
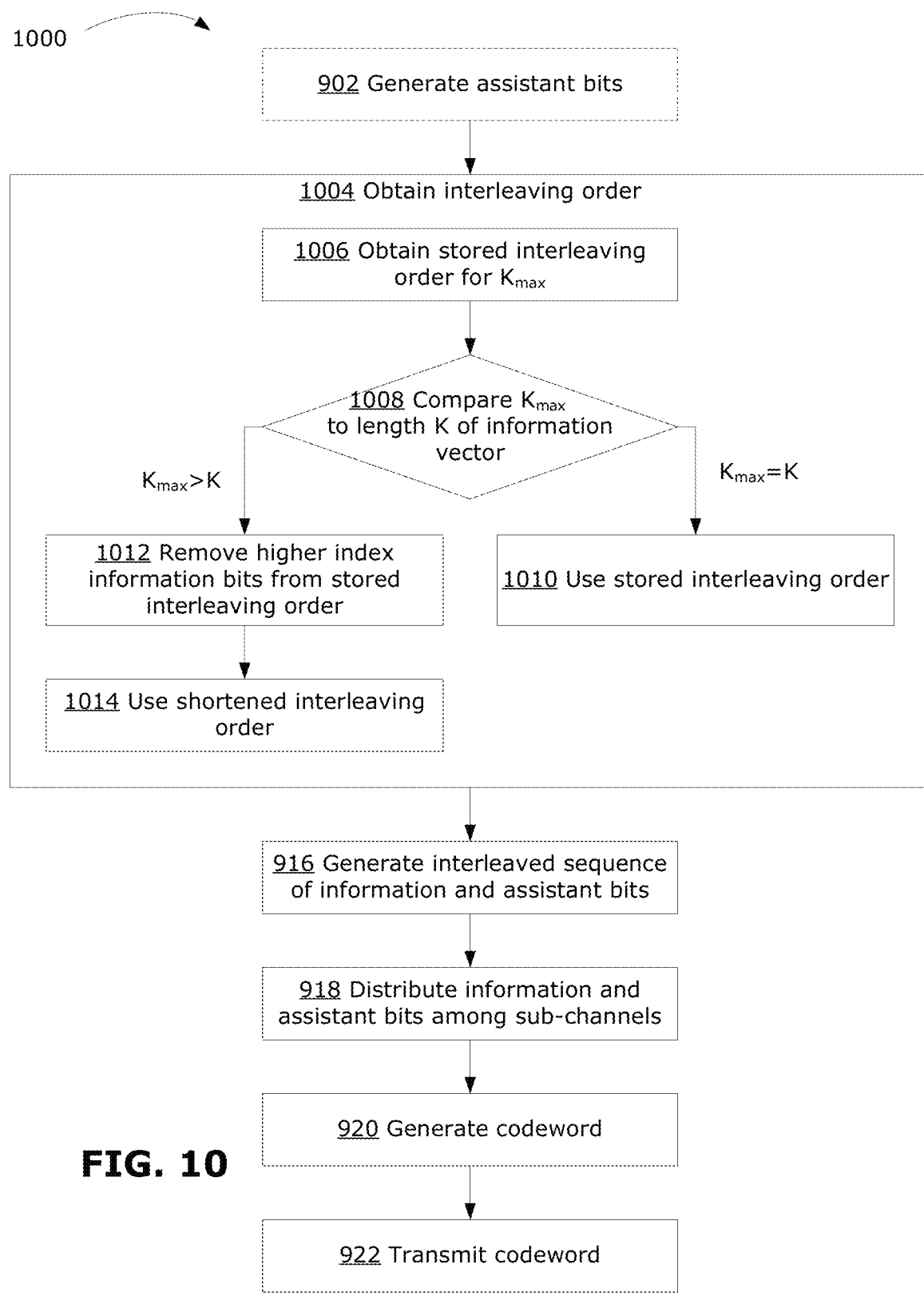
FIG. 10 is a flowchart of an example method for distributing information and assistant bits using a pre-calculated interleaving order.

FIG. 10 is a flowchart illustrating an example method 1000 in which a shortened interleaving order is calculated from a stored interleaving order. The method 1000 may be suitable where the PC matrix has the nested property that $P_K$ contains all $P_{K'}$, $K'<K$, for example where the PC matrix is generated from a generator polynomial such as a CRC polynomial. The method 1000 may include steps similar to the example method 900 discussed above. FIG. 10 more particularly illustrates how the stored interleaving order may be used, depending on the length of the information vector. It should be noted that the length of the information vector may also be referred to as the number of information bits K. Optionally, the method 1000 may include generation of the assistant bits from the inputted information bits at 906, as described above with reference to FIG. 9.

At 1004, an interleaving order for interleaving the information and assistant bits is obtained. In the example method 1000, obtaining an interleaving order may include obtaining a stored interleaving order at 1006, similar to 906 of FIG. 9 described above. FIG. 10 takes into consideration the scenario that the stored interleaving order may have been calculated for a number of information bits $K_{max}$ that might be larger than the actual number of information bits $K$ inputted to the encoder.

At 1008, a comparison is made between $K_{max}$ and the length $K$ of the inputted information vector.

If $K_{max}=K$, then, at 1010, the stored interleaving order may be used as-is, and the method 1000 may proceed to 916.

If $K_{max}>K$, then at 1012, a shortened interleaving order is obtained by removing the information bits having an index of $K$ or higher from the stored interleaving order.

At 1014, the shortened interleaving order is used and the method may proceed to 916.

The method 1000 may thus proceed with steps 916 to 922 as described above with reference to FIG. 9.

In some examples, the method 1000 may be performed by a transmitting ED, for example the apparatus 400 of FIG. 4, using the encoder 404, for example using the assistant bit generator 410 and interleaver 412. In some examples, the method 1000 may be combined with the method 900, for example by performing 1006 to 1014 in place of 906. The receiving ED is also informed of the stored interleaving order(s) used by the transmitting ED and, if there are more than one stored interleaving orders, how one interleaving order is selected for use (e.g., by selecting the interleaving order that requires fewer information bits to be removed to generating a shortened interleaving order).

The present disclosure describes interleaving information and assistant bits for distribution over the sub-channels, so as to promote the possibility of earlier ET. The information bits in the interleaved sequence are not necessarily in the original order in which they were inputted in the information vector.

Although examples are described herein with reference to bits, other embodiments may involve non-binary and/or multi-bit symbols. For example, if a sub-channel can transmit more than one bit, then several bits can be combined into a symbol in a defined alphabet, and a non-binary symbol may be transmitted for each sub-channel. Accordingly, polarization kernels are not limited to binary kernels. Symbol-level (e.g., Galois field) or non-binary kernels are also contemplated. A non-binary kernel could be selected for its higher degree of polarization than a binary kernel. Decoding computation complexity is typically higher for a non-binary kernel, because a decoder would handle symbols rather than bits. Non-binary kernels may possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

As noted previously, polar codes may be used for uplink and downlink eMBB control channel coding for the 5G air interface. The present disclosure may be applicable for encoding control data over a control channel (e.g. PDCCH) as well as for encoding other types of data (e.g. user data) over any type of channel (e.g. a data channel).

Although described in the context of a polar code, the present disclosure may be applicable to other channel codes. For example, the present disclosure may be applicable to any channel code which adds assistant bits (e.g., CRC bits or other redundancy parity bits) to the information bits and distributes the assistant bits among the information bits then encodes the result. Distribution of the assistant bits may be different for different channel codes. An example of such a channel code is distributed CRC-polar coding, where the assistant bits are appended to the information vector, the positions of the assistant bits are then adjusted in the sub-channels and a polar encoder encodes the result. Another example may be a channel code in which a convolutional code is used to encode the result.

Although the present disclosure may describe methods and processes with steps in a certain order, one or more steps of the methods and processes may be omitted or altered as appropriate. One or more steps may take place in an order other than that in which they are described, as appropriate.

Although the present disclosure may be described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. An apparatus comprising:
   a polar encoder configured to:
   generate an interleaved sequence of information bits and assistant bits according to an interleaving order, wherein the interleaving order is selected to reduce a number of information bits occurring before a first assistant bit and further reduce each subsequent number of additional information bits occurring between assistant bits;
   wherein the interleaving order has a selected one of the assistant bits as the first assistant bit in the interleaving order, the selected one assistant bit being dependent on a smallest set of relevant information bits among all assistant bits, the information bits on which the first assistant bit depends being placed first in the interleaving order among all information bits; and wherein each subsequent assistant bits in the interleaving order is associated with a respective next smallest number of the additional information bits; and encode the interleaved sequence using a polar code to generate a codeword; and a transmitter, coupled to the encoder, for transmitting the codeword.

2. The apparatus of claim 1, wherein the encoder is further configured to:

generate the assistant bits by applying a parity check matrix to the information bits.

3. The apparatus of claim 2, wherein the parity check matrix is calculated using a parity check polynomial.

4. The apparatus of claim 1, further comprising a memory coupled to the encoder, the memory storing a stored interleaving order, wherein the encoder uses the stored interleaving order as the interleaving order for generating the interleaved sequence.

5. The apparatus of claim 4, wherein the memory stores a plurality of stored interleaving orders, each stored interleaving order being associated with a respective number of information bits, wherein the encoder is further configured to:

select, for a given number of information bits inputted to the encoder, one of the stored interleaving orders for generating the interleaved sequence, wherein the selected interleaving order is associated with a number of information bits that is (a) equal to or greater than the given number of information bits and (b) closest to the given number of information bits.

6. The apparatus of claim 4, wherein the encoder is further configured to:

when the stored interleaving order includes one or more higher index information bits that has a higher index than the information bits inputted to the encoder:

remove the one or more higher index information bits from the interleaving order to generate a shortened interleaving order; and use the shortened interleaving order as the interleaving order for generating the interleaved sequence.

7. The apparatus of claim 1, wherein the encoder is further configured to:

generate the interleaving order by:

selecting one of the assistant bits as the first assistant bit in the interleaving order, the selected one assistant bit being associated with the smallest set of relevant information bits among all assistant bits; and iteratively selecting each respective subsequent assistant bits in the interleaving order by selecting, from unselected assistant bits, an assistant bit dependent on the respective next smallest number of additional information bits.

8. The apparatus of claim 7, wherein the interleaving order is generated for a given number of information bits inputted to the encoder, and wherein the encoder is further configured to:

store the generated interleaving order as an interleaving order associated with the given number of information bits.

9. An apparatus comprising:

a polar encoder configured to:

obtain, from a memory coupled to the encoder, a stored interleaving order for interleaving K inputted information bits and m assistant bits, wherein the stored interleaving order is selected according to a maximum number $K_{max}$ of information bits, the stored interleaving order being selected to minimize a number of information bits occurring before a first assistant bit and further minimize each subsequent number of additional information bits occurring between assistant bits;

when the number K of inputted information bits is equal to $K_{max}$, generate an interleaved sequence of information bits and assistant bits according to the stored interleaving order;

when the number K of inputted information bits is less than $K_{max}$, generate an interleaved sequence of information bits and assistant bits according to a shortened interleaving order, the shortened interleaving order being obtained by removing from the stored interleaving order all information bits having an index of K or greater; and encode the interleaved sequence using a polar code to generate a codeword; and a transmitter, coupled to the encoder, for transmitting the codeword.

10. The apparatus of claim 9, wherein the encoder is further configured to:

generate the assistant bits by applying a parity check matrix to the information bits.

11. A method comprising:

generating an interleaved sequence of information bits and assistant bits according to an interleaving order, wherein the interleaving order is selected to reduce a number of information bits occurring before a first assistant bit and further reduce each subsequent number of additional information bits occurring between assistant bits;

wherein the interleaving order has a selected one of the assistant bits as the first assistant bit in the interleaving order, the selected one assistant bit being dependent on a smallest set of relevant information bits among all assistant bits, the information bits on which the first assistant bit depends being placed first in the interleaving order among all information bits; and wherein each subsequent assistant bits in the interleaving order is associated with a respective next smallest number of the additional information bits;

encoding the interleaved sequence using a polar code to generate a codeword; and transmitting the codeword.

12. The method of claim 11, further comprising:

generating the assistant bits by applying a parity check matrix to the information bits.

13. The method of claim 12, further comprising:

calculating the parity check matrix using a parity check polynomial.

14. The method of claim 11, further comprising:

using a stored interleaving order as the interleaving order for generating the interleaved sequence.

15. The method of claim 14, wherein there is a plurality of stored interleaving orders, each stored interleaving order being associated with a respective number of information bits, the method further comprising:

selecting, for a given number of information bits to be encoded, one of the stored interleaving orders for generating the interleaved sequence, wherein the selected interleaving order is associated with a number of information bits that is (a) equal to or greater than the given number of information bits and (b) closest to the given number of information bits.

16. The method of claim 14, further comprising:
when the stored interleaving order includes one or more higher index information bits that has a higher index than the information bits inputted to the encoder:
removing the one or more higher index information bits from the interleaving order to generate a shortened interleaving order; and
using the shortened interleaving order as the interleaving order for generating the interleaved sequence.

17. The method of claim 11, wherein generating the interleaving order comprises:
selecting one of the assistant bits as the first assistant bit in the interleaving order, the selected one assistant bit being associated with the smallest set of relevant information bits among all assistant bits; and
iteratively selecting each respective subsequent assistant bits in the interleaving order by selecting, from unselected assistant bits, an assistant bit dependent on the respective next smallest number of additional information bits.

18. The method of claim 17, wherein the interleaving order is generated for a given number of information bits to be encoded, the method further comprising:
storing the generated interleaving order as an interleaving order associated with the given number of information bits.

19. A method comprising:
obtaining a stored interleaving order for interleaving K inputted information bits and m assistant bits, wherein the stored interleaving order is selected according to a maximum number $K_{max}$ of information bits, the stored interleaving order being selected to minimize a number of information bits occurring before a first assistant bit and further minimize each subsequent number of additional information bits occurring between assistant bits;
when the number K of inputted information bits is equal to $K_{max}$, generating an interleaved sequence of information bits and assistant bits according to the stored interleaving order;
when the number K of inputted information bits is less than $K_{max}$, generating an interleaved sequence of information bits and assistant bits according to a shortened interleaving order, the shortened interleaving order being obtained by removing from the stored interleaving order all information bits having an index of K or greater;
encoding the interleaved sequence using a polar code to generate a codeword; and
transmitting the codeword.

20. The method of claim 19, further comprising:
generating the assistant bits by applying a parity check matrix to the information bits.

* * * * *